US011335780B2

(12) United States Patent
Liu et al.

(10) Patent No.: US 11,335,780 B2
(45) Date of Patent: May 17, 2022

(54) EPITAXIAL STRUCTURE

(71) Applicant: GlobalWafers Co., Ltd., Hsinchu (TW)

(72) Inventors: Jia-Zhe Liu, Hsinchu (TW); Ying-Ru Shih, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 72 days.

(21) Appl. No.: 16/883,988

(22) Filed: May 26, 2020

(65) Prior Publication Data
US 2021/0050422 A1    Feb. 18, 2021

(30) Foreign Application Priority Data

Aug. 12, 2019  (TW) .................................. 108128572

(51) Int. Cl.
| | | |
|---|---|---|
| *H01L 29/205* | (2006.01) | |
| *H01L 29/778* | (2006.01) | |
| *H01L 29/20* | (2006.01) | |
| *H01L 29/15* | (2006.01) | |

(52) U.S. Cl.
CPC .......... *H01L 29/205* (2013.01); *H01L 29/155* (2013.01); *H01L 29/2003* (2013.01); *H01L 29/7786* (2013.01)

(58) Field of Classification Search
CPC ............. H01L 21/0251; H01L 29/2003; H01L 21/02458; H01L 21/0254
See application file for complete search history.

(56) References Cited

U.S. PATENT DOCUMENTS

| | | | |
|---|---|---|---|
| 9,768,258 B1* | 9/2017 | Prechtl | ................ H01L 29/7784 |
| 2010/0270591 A1 | 10/2010 | Ahn | |
| 2019/0221648 A1* | 7/2019 | Liu | .................... H01L 21/02458 |
| 2019/0237550 A1* | 8/2019 | Uesugi | ................ H01L 29/4232 |

FOREIGN PATENT DOCUMENTS

| | | |
|---|---|---|
| CN | 103594509 | 2/2014 |
| CN | 108231556 | 6/2018 |
| TW | 201508915 | 3/2015 |
| TW | 201611330 | 3/2016 |
| TW | 201719732 | 6/2017 |
| TW | 201829308 | 8/2018 |
| TW | 201838175 | 10/2018 |
| TW | 201929044 | 7/2019 |

* cited by examiner

*Primary Examiner* — Fernando L Toledo
*Assistant Examiner* — Valerie N Newton
(74) *Attorney, Agent, or Firm* — JCIPRNET

(57) ABSTRACT

An epitaxial structure includes a substrate, a buffer layer, a back diffusion barrier layer, a channel layer formed on the back diffusion barrier layer, and a barrier layer formed on the channel layer. The buffer layer is formed on the substrate. The back diffusion barrier layer is formed on the buffer layer. The chemical composition of the back diffusion barrier layer is $Al_xIn_yGa_{1-x-y}N$, wherein $0 \leq x \leq 1$ and $0 \leq y \leq 1$. The lattice constant of the back diffusion barrier layer is between 2.9 Å and 3.5 Å. The back diffusion barrier layer is composed of a plurality of regions in the thickness direction, and the aluminum (Al) content and the indium (In) content of the back diffusion barrier layer are changed stepwise or gradually changed stepwise along the thickness direction. The back diffusion barrier layer further includes carbon, and the carbon concentration is changed stepwise or gradually changed stepwise along the thickness direction.

16 Claims, 11 Drawing Sheets

EPITAXIAL STRUCTURE

CROSS-REFERENCE TO RELATED APPLICATION

This application claims the priority benefit of Taiwan patent applications serial no. 108128572, filed on Aug. 12, 2019. The entirety of the above-mentioned patent application is hereby incorporated by reference herein and made a part of this specification.

BACKGROUND OF THE INVENTION

Field of the Invention

This invention relates to a semiconductor structure, and more particularly, to an epitaxial structure.

Description of Related Art

Gallium nitride (GaN) has advantages such as higher frequency and output power, and therefore is currently widely used in the semiconductor epitaxial process and is suitable for application in 5G base stations.

However, the traditional diffusion barrier layer using a gallium nitride material may effectively reduce the diffusion of impurities to the channel layer, but this method cannot alleviate the overflow of the 2D electron gas (2DEG) to the buffer layer, which may readily affect device characteristics.

In addition, in order to improve the carrier limitation ability, in the traditional structure, a layer of aluminum gallium nitride (AlGaN) is usually formed as a barrier layer to prevent a carrier from moving toward the buffer layer, thus improving the DC and leakage current characteristics. However, due to the difference in lattice constant, the quality of the gallium nitride layer subsequently formed as a channel layer is readily deteriorated. Furthermore, the barrier layer may not effectively prevent iron from diffusing to the channel layer, thereby affecting device characteristics.

SUMMARY OF THE INVENTION

The invention provides an epitaxial structure, wherein the lattice matching of the epitaxial structure may be improved, and interface defects may be reduced, and at the same time a diffusion barrier effect may be achieved and carrier limitation ability may be improved, thereby improving device characteristics.

The epitaxial structure of the invention includes a substrate, a buffer layer, a back diffusion barrier layer, a channel layer, and a barrier layer. The buffer layer is formed on the substrate, the back diffusion barrier layer is formed on the buffer layer, the channel layer is formed on the back diffusion barrier layer, and the barrier layer is formed on the channel layer. A chemical composition of the back diffusion barrier layer is $Al_xIn_yGa_{1-x-y}N$, wherein $0 \leq x \leq 1$ and $0 \leq y \leq 1$; a lattice constant is between 2.9 Å and 3.5 Å, the back diffusion barrier layer is composed of a plurality of regions in a thickness direction; an aluminum content and an indium content are changed stepwise or gradually changed stepwise along the thickness direction; and the back diffusion barrier layer further includes a carbon, and a carbon concentration is changed stepwise or gradually changed stepwise along the thickness direction.

In an embodiment of the invention, in the back diffusion barrier layer, the aluminum content is increased stepwise along the thickness direction, the indium content is increased stepwise along the thickness direction, a step slope of the aluminum content is 0.1%/step to 50%/step, and a step slope of the indium content is 0.1%/step to 20%/step; a starting value of the aluminum content is 0% to 50%, an end value of the aluminum content is 50% to 100%, a starting value of the indium content is 0% to 50%, and an end value of the indium content is 5% to 50%; an energy gap (Eg) of the back diffusion barrier layer is increased stepwise from $3.4 \pm 1$ eV to $5.03 \pm 1$ eV along the thickness direction; and the carbon concentration of the back diffusion barrier layer is increased stepwise along the thickness direction, with a starting value of $1E16$ $cm^{-3}$ to $1E18$ $cm^{-3}$ and an end value of $1E17$ $cm^{-3}$ to $1E19$ $cm^{-3}$.

In an embodiment of the invention, in the back diffusion barrier layer, the aluminum content is reduced stepwise along the thickness direction, the indium content is reduced stepwise along the thickness direction, a step slope of the aluminum content is $-0.1$%/step to $-50$%/step, and a step slope of the indium content is $-0.1$%/step to $-20$%/step; a starting value of the aluminum content is 50% to 100%, an end value of the aluminum content is 0% to 50%, a starting value of the indium content is 5% to 50%, and an end value of the indium content is 0% to 50%; an energy gap of the back diffusion barrier layer is reduced stepwise from $5.03 \pm 1$ eV to $3.4 \pm 1$ eV along the thickness direction; and the carbon concentration of the back diffusion barrier layer is reduced stepwise along the thickness direction, with a starting value of $1E17$ $cm^{-3}$ to $1E19$ $cm^{-3}$ and an end value of $1E16$ $cm^{-3}$ to $1E18$ $cm^{-3}$.

In an embodiment of the invention, in the back diffusion barrier layer, the aluminum content is gradually increased stepwise along the thickness direction, the indium content is gradually increased stepwise along the thickness direction, and a step slope of the aluminum content is 0.1%/step to 50%/step, a step slope of the indium content is 0.1%/step to 20%/step, a gradient slope of the aluminum content is 1%/nm to 50%/nm, and a gradient slope of the indium content is 1%/nm to 10%/nm; a starting value of the aluminum content is 0% to 50%, an end value of the aluminum content is 50% to 100%, a starting value of the indium content is 0% to 50%, and an end value of the indium content is 5% to 50%; an energy gap of the back diffusion barrier layer is gradually increased stepwise from $3.4 \pm 1$ eV to $5.03 \pm 1$ eV along the thickness direction; and the carbon concentration of the back diffusion barrier layer is gradually increased stepwise along the thickness direction, with a starting value of $1E16$ $cm^{-3}$ to $1E18$ $cm^{-3}$ and an end value of $1E17$ $cm^{-3}$ to $1E19$ $cm^{-3}$.

In an embodiment of the invention, in the back diffusion barrier layer, the aluminum content is gradually reduced stepwise along the thickness direction, the indium content is gradually reduced stepwise along the thickness direction, a step slope of the aluminum content is $-0.1$%/step to $-50$%/step, and a step slope of the indium content is $-0.1$%/step to $-20$%/step, a gradient slope of the aluminum content is $-1$%/nm to $-50$%/nm, and a gradient slope of the indium content is $-1$%/nm to $-10$%/nm; a starting value of the aluminum content is 50% to 100%, an end value of the aluminum content is 0% to 50%, a starting value of the indium content is 5% to 50%, and an end value of the indium content is 0% to 50%; an energy gap of the back diffusion barrier layer is gradually reduced stepwise from $5.03 \pm 1$ eV to $3.4 \pm 1$ eV along the thickness direction; and the carbon concentration of the back diffusion barrier layer is gradually reduced stepwise along the thickness direction, with a starting value of $1E17$ $cm^{-3}$ to $1E19$ $cm^{-3}$ and an end value of $1E16$ $cm^{-3}$ to $1E18$ $cm^{-3}$.

In an embodiment of the invention, a thickness of the back diffusion barrier layer is between 1 nm and 200 nm and a number of layers thereof is 2 to 30.

Another epitaxial structure of the invention includes a substrate, a buffer layer, a back diffusion barrier layer, a channel layer, and a barrier layer. The buffer layer is formed on the substrate, the back diffusion barrier layer is formed on the buffer layer, the channel layer is formed on the back diffusion barrier layer, and the barrier layer is formed on the channel layer. The back diffusion barrier layer is composed by alternately stacking a plurality of gallium nitride films and a plurality of aluminum indium gallium nitride films in a thickness direction, wherein a chemical composition of the aluminum indium gallium nitride films is $Al_xIn_yGa_{1-x-y}N$, and $0 \leq x \leq 1$ and $0 \leq y \leq 1$, a lattice constant of the back diffusion barrier layer is between 2.9 Å and 3.5 Å, an aluminum content and an indium content of the plurality of aluminum indium gallium nitride films are changed stepwise or gradually changed stepwise along the thickness direction, the back diffusion barrier layer may further include a carbon, and a carbon concentration is changed stepwise or gradually changed stepwise along the thickness direction.

In another embodiment of the invention, in the plurality of aluminum indium gallium nitride films, the aluminum content is increased stepwise along the thickness direction, the indium content is increased stepwise along the thickness direction, a step slope of the aluminum content is 0.1%/step to 50%/step, and a step slope of the indium content is 0.1%/step to 20%/step; a starting value of the aluminum content is 0% to 50%, an end value of the aluminum content is 50% to 100%, a starting value of the indium content is 0% to 50%, and an end value of the indium content is 5% to 50%; an energy gap of the plurality of aluminum indium gallium nitride films is increased stepwise from 3.4±1 eV to 5.03±1 eV along the thickness direction; and the carbon concentration of the back diffusion barrier layer is increased stepwise along the thickness direction, with a starting value of 1E16 $cm^{-3}$ to 1E18 $cm^{-3}$ and an end value of 1E17 $cm^{-3}$ to 1E19 $cm^{-3}$.

In another embodiment of the invention, in the plurality of aluminum indium gallium nitride films, the aluminum content is reduced stepwise along the thickness direction, the indium content is reduced stepwise along the thickness direction, a step slope of the aluminum content is −0.1%/step to −50%/step, and a step slope of the indium content is −0.1%/step to −20%/step; a starting value of the aluminum content is 50% to 100%, an end value of the aluminum content is 0% to 50%, a starting value of the indium content is 5% to 50%, and an end value of the indium content is 0% to 50%; an energy gap of the plurality of aluminum indium gallium nitride films is reduced stepwise from 5.03±1 eV to 3.4±1 eV along the thickness direction; and the carbon concentration of the back diffusion barrier layer is reduced stepwise along the thickness direction, with a starting value of 1E17 $cm^{-3}$ to 1E19 $cm^{-3}$ and an end value of 1E16 $cm^{-3}$ to 1E18 $cm^{-3}$.

In another embodiment of the invention, the aluminum content and the indium content of each layer in the plurality of aluminum indium gallium films are both composed of a three-stage change, wherein the three-stage change includes a first gradient region gradually changed from 0 to a maximum value, a fixed region fixed at the maximum value, and a second gradient region gradually changed from the maximum value to 0. A value of the fixed region is increased stepwise along the thickness direction, and a step slope of the aluminum content is 0.1%/step to 50%/step and a step slope of the indium content is 0.1%/step to 20%/step. A gradient slope of the aluminum content of the first gradient region is 1%/nm to 50%/nm, and a gradient slope of the indium content is 1%/nm to 10%/nm. A gradient slope of the aluminum content of the second gradient region is −1%/nm to −50%/nm, and a gradient slope of the indium content is −1%/nm to −10%/nm. In the plurality of aluminum indium gallium nitride films, a starting value of the aluminum content is 0% to 50%, an end value of the aluminum content is 50% to 100%, a starting value of the indium content is 0% to 50%, and an end value of the indium content is 5% to 50%.

In another embodiment of the invention, an energy gap of each layer in the plurality of aluminum indium gallium films is composed of a three-stage change, wherein the three-stage change includes a first gradient region gradually changed from a minimum value to a maximum value, a fixed region fixed at the maximum value, and a second gradient region gradually changed from the maximum value to the minimum value. The minimum value of the energy gap in the plurality of aluminum indium gallium nitride films is the same, and a value of the fixed region is increased stepwise from 3.4±1 eV to 5.03±1 eV along the thickness direction.

In another embodiment of the invention, the carbon concentration of the back diffusion barrier layer is increased stepwise along the thickness direction, with an initial value of 1E16 $cm^{-3}$ to 1E18 $cm^{-3}$ and an end value of 1E17 $cm^{-3}$ to 1E19 $cm^{-3}$.

In another embodiment of the invention, the aluminum content and the indium content of each layer in the plurality of aluminum indium gallium films are both composed of a three-stage change, wherein the three-stage change includes a first gradient region gradually changed from 0 to a maximum value, a fixed region fixed at the maximum value, and a second gradient region gradually changed from the maximum value to 0. A value of the fixed region is reduced stepwise along the thickness direction, and a step slope of the aluminum content is −0.1%/step to −50%/step and a step slope of the indium content is −0.1%/step to −20%/step. A gradient slope of the aluminum content of the first gradient region is 1%/nm to 50%/nm, and a gradient slope of the indium content is 1%/nm to 10%/nm. A gradient slope of the aluminum content of the second gradient region is −1%/nm to −50%/nm, and a gradient slope of the indium content is −1%/nm to −10%/nm. In the plurality of aluminum indium gallium nitride films, a starting value of the aluminum content is 50% to 100%, an end value of the aluminum content is 0% to 50%, a starting value of the indium content is 5% to 50%, and an end value of the indium content is 0% to 50%.

In another embodiment of the invention, an energy gap of each layer in the plurality of aluminum indium gallium films is composed of a three-stage change, wherein the three-stage change includes a first gradient region gradually changed from a minimum value to a maximum value, a fixed region fixed at the maximum value, and a second gradient region gradually changed from the maximum value to the minimum value. The minimum value of the energy gap in the plurality of aluminum indium gallium nitride films is the same, and a value of the fixed region is reduced stepwise from 5.03±1 eV to 3.4±1 eV along the thickness direction.

In another embodiment of the invention, the carbon concentration of the back diffusion barrier layer is reduced stepwise along the thickness direction, with an initial value of 1E17 $cm^{-3}$ to 1E19 $cm^{-3}$ and an end value of 1E16 $cm^{-3}$ to 1E18 $cm^{-3}$.

In an embodiment of the invention, a thickness of the back diffusion barrier layer is between 1 nm and 5000 nm, a thickness of the aluminum indium gallium nitride films is between 1 nm and 600 nm, and a number of layers thereof is 2 to 30.

Based on the above, in the invention, via the back diffusion barrier layer having a specific aluminum content change and indium content change disposed between the buffer layer and the channel layer, the lattice matching of the epitaxial structure is increased, the interface defect density is reduced, and the quality of the channel layer is maintained. At the same time, a diffusion barrier effect is achieved and carrier limitation ability is increased, such that characteristics such as direct current (DC), leakage current, dynamic characteristics, and radio frequency (RF) of the device are improved.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
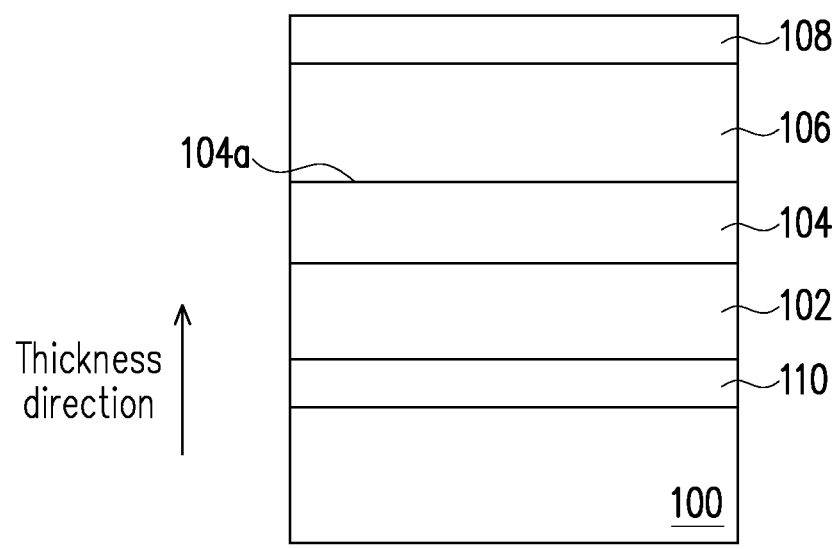
FIG. 1 is a cross-sectional view of an epitaxial structure of the first embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

FIG. 1 is a cross-sectional view of an epitaxial structure of the first embodiment of the invention.

Referring to FIG. 1, an epitaxial structure of the present embodiment includes a substrate 100, a buffer layer 102, a back diffusion barrier layer 104, a channel layer 106, and a barrier layer 108. The buffer layer 102 is formed on the substrate 100, the back diffusion barrier layer 104 is formed on the buffer layer 102, the channel layer 106 is formed on the back diffusion barrier layer 104, and the barrier layer 108 is formed on the channel layer 106. The chemical composition of the back diffusion barrier layer 104 is $Al_xIn_yGa_{1-x-y}N$, wherein $0 \leq x \leq 1$ and $0 \leq y \leq 1$, such as $0.1 \leq x \leq 0.8$ and $0.022 \leq y \leq 0.176$, wherein x represents Al (aluminum) content, y represents In (indium) content, and 1-x-y represents Ga (gallium) content. The lattice constant of the back diffusion barrier layer 104 is between 2.9 Å and 3.5 Å, and the back diffusion barrier layer 104 is composed of a plurality of regions in the thickness direction. In addition, the definition of one "region" in the present specification is a variation of the x value and the y value, but the number of regions does not necessarily represent the number of layers. Due to the process, a single layer structure may contain a plurality of variations of the x value and the y value. Therefore, a single layer may be single or composed of a plurality of regions, but the invention is not limited thereto. In addition, the aluminum content and the indium content of the back diffusion barrier layer 104 are changed stepwise or gradually changed stepwise along the thickness direction. The changes in the aluminum content and the indium content of the back diffusion barrier layer 104 are described in detail below.

Please continue to refer to FIG. 1. The material of the substrate 100 is, for example, silicon (Si), gallium arsenide (GaAs), gallium nitride, silicon carbide (SiC), aluminum oxide ($Al_2O_3$), or other suitable materials. The material of the buffer layer 102 is, for example, doped with doped (high resistance) gallium nitride, wherein the doping concentration of the buffer layer 102 is, for example, 1E17 $cm^{-3}$ to 5E18 $cm^{-3}$, preferably 4E17 $cm^{-3}$ to 2E18 $cm^{-3}$. In an embodiment, the dopant of the buffer layer 102 includes iron, magnesium, carbon, and silicon, for example. The material of the channel layer 106 is, for example, gallium nitride (GaN). The material of the barrier layer 108 is, for example, aluminum nitride (AlN), indium nitride (InN), aluminum indium nitride (AlInN), aluminum gallium indium nitride (AlGnInN), or the like. In addition, in order to reduce the stress of the epitaxial structure and adjust the warpage of the epitaxial structure after epitaxial growth, a nucleation layer 110 may be formed between the substrate 100 and the buffer layer 102, and the material thereof is, for example, aluminum indium nitride, etc.

In the present embodiment, the back diffusion barrier layer 104 further includes carbon. For example, the carbon concentration of the back diffusion barrier layer 104 is changed stepwise or gradually changed stepwise along the thickness direction, but the invention is not limited thereto. The carbon concentration of the back diffusion barrier layer 104 is, for example, less than 1E19 cm$^{-3}$. The carbon concentration change of the back diffusion barrier layer 104 is described in detail below.

In the present embodiment, the forming temperature of the back diffusion barrier layer 104 is, for example, changed stepwise or gradually changed stepwise along the thickness direction, but the invention is not limited thereto. In particular, the diffusion of the dopant is changed with the forming temperature. For example, the carbon concentration is increased as the forming temperature is higher and reduced as the forming temperature is reduced. Therefore, the forming temperature of the back diffusion barrier layer may be deduced by the carbon concentration change. The forming temperature change of the back diffusion barrier layer 104 is described in detail below.

In the present embodiment, the roughness (rms) of an interface 104a between the back diffusion barrier layer 104 and the channel layer 106 is, for example, between 0.1 nm and 5 nm, preferably between 0.1 nm and 2 nm. The thickness of the back diffusion barrier layer 104 is, for example, between 1 nm and 200 nm, preferably between 1 nm and 50 nm. The number of layers of the back diffusion barrier layer 104 is, for example, 2 to 30, preferably 2 to 10.

In the present embodiment, by disposing the back diffusion barrier layer 104, the lattice matching of the epitaxial structure may be improved via a specific aluminum content change and indium content change, and forming temperature change, thereby reducing interface defects. At the same time, a diffusion barrier effect is achieved and carrier limitation ability is improved, thereby improving device characteristics.

Figure 2:
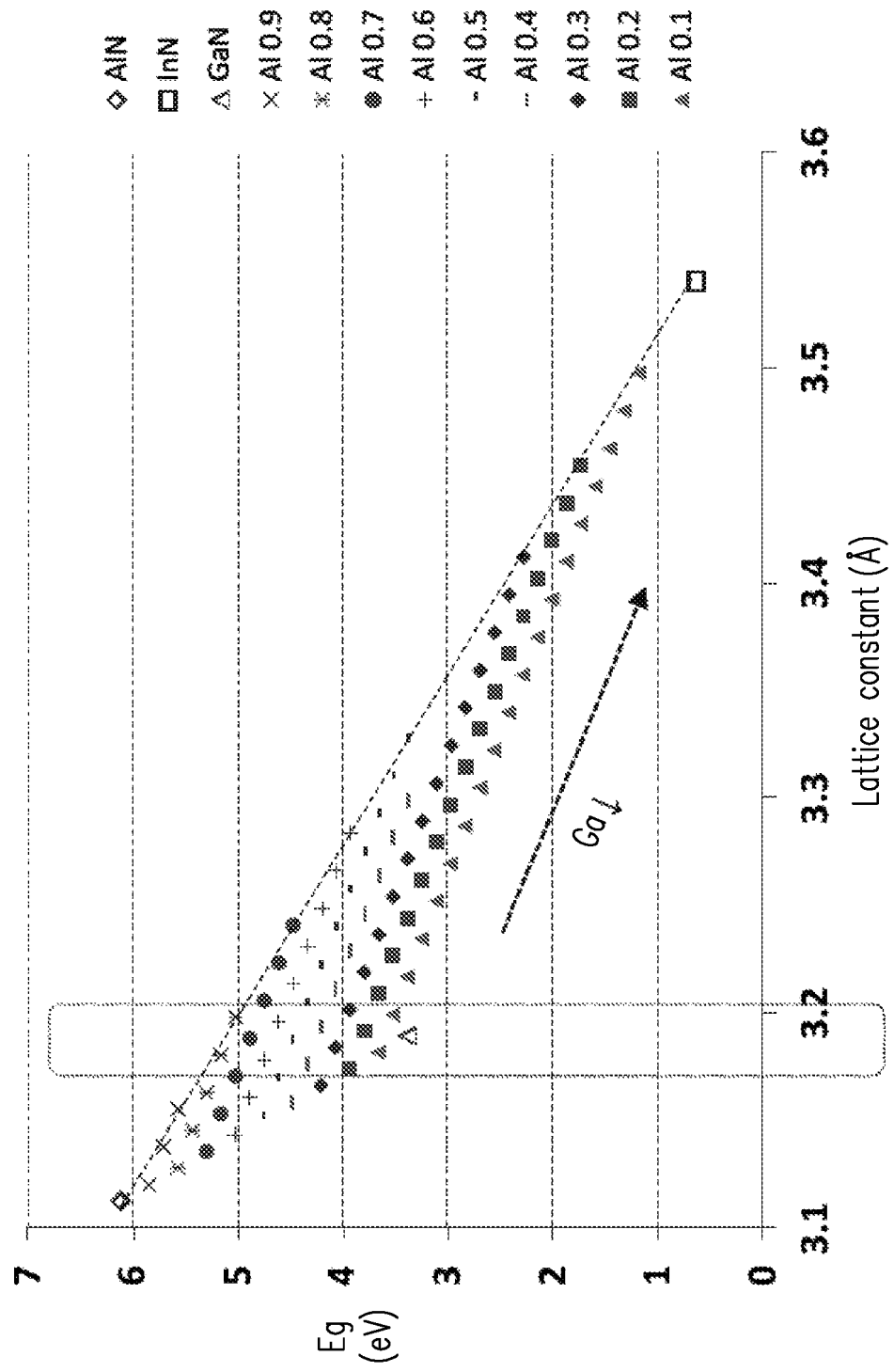
FIG. 2 is a graph showing the relationship between lattice constants and energy gaps of different chemical compositions of the back diffusion barrier layer of the epitaxial structure of the first embodiment.

FIG. 2 is a graph showing the relationship between lattice constants and energy gaps of different chemical compositions of the back diffusion barrier layer of the epitaxial structure of the first embodiment.

In the present embodiment, by changing the aluminum content and indium content of the chemical composition $Al_xIn_yGa_{1-x-y}N$ of the back diffusion barrier layer 104, the relationship between energy gap (Eg) and lattice constant of the back diffusion barrier layer 104 may be obtained, wherein the relationship is plotted in FIG. 2. When the x value representing the aluminum content is 1 and the y value representing the indium content is 0, that is, the chemical composition of the back diffusion barrier layer 104 is AlN, the energy gap thereof is about 6.13 eV and the lattice constant thereof is about 3.11 Å. When the x value is 0 and the y value is 1, that is, the chemical composition of the back diffusion barrier layer 104 is InN, the energy gap thereof is about 0.64 eV and the lattice constant thereof is about 3.54 Å. When the x value is 0 and the y value is 0, that is, the chemical composition of the back diffusion barrier layer 104 is GaN, the energy gap thereof is about 3.4 eV and the lattice constant thereof is about 3.189 Å. Furthermore, as the x value is increased from 0.1, 0.2, 0.3, 0.4, 0.5, 0.6, 0.7 to 0.8, the resulting energy gap is higher, and the energy gap corresponding to each x value has a linear relationship with the lattice constant. In addition, when the x value is a fixed value, as the content of gallium is reduced (as indicated by the arrow in FIG. 2), that is, the indium content is increased, the resulting lattice constant is higher.

Moreover, the aluminum content and the indium content of the back diffusion barrier layer 104 may be adjusted via FIG. 2 such that the epitaxial structure formed subsequently has better near-lattice matching or lattice matching, and at the same time has a high energy gap. For example, a lattice constant matching the lattice constant of GaN may be selected for adjustment. For example, when the lattice constant is selected to be 3.189, the relevant values obtained via FIG. 2 are listed in Table 1 below. In this way, the difference in lattice constant between the back diffusion barrier layer 104 and the channel layer 106 or the buffer layer 102 may be reduced, and an epitaxial structure with both high energy gap and better lattice matching may be obtained.

TABLE 1

| (Al(%) + In(%) + Ga(%) = 100%) | | | | |
|---|---|---|---|---|
| Aluminum content (%) | Indium content (%) | GaN content (%) | Lattice constant (Å) | Eg (eV) |
| 0.8 | 0.176 | 0.024 | 3.189 | 5.098 |
| 0.7 | 0.154 | 0.146 | 3.189 | 4.89 |
| 0.6 | 0.132 | 0.268 | 3.189 | 4.674 |
| 0.5 | 0.110 | 0.390 | 3.189 | 4.461 |
| 0.4 | 0.088 | 0.512 | 3.189 | 4.249 |
| 0.3 | 0.066 | 0.634 | 3.189 | 4.037 |
| 0.2 | 0.044 | 0.756 | 3.189 | 3.825 |
| 0.1 | 0.022 | 0.878 | 3.189 | 3.612 |

FIG. 3 to FIG. 6 are diagrams of chemical composition content change, forming temperature change, and characteristic change of the back diffusion barrier layer along the thickness direction in the epitaxial structure of the first embodiment, wherein "chemical composition content" refers to aluminum content, indium content, and gallium content, and "characteristic" refers to energy gap and lattice constant.

In the following, the "increased stepwise" refers to the aluminum content, indium content, or forming temperature or other values gradually increasing along the thickness direction. For example, there are a plurality of step sections in the figures, and the value in each step section is unchanged. The "reduced stepwise" refers to the aluminum content, indium content, or forming temperature or other values gradually reducing along the thickness direction. For example, there are a plurality of step sections in the figures, and the value of each step section is unchanged. The "gradually increased stepwise" is defined as the change in the minimum value of the aluminum content, indium content, or forming temperature or other values in several regions increasing along the thickness direction (for example, the aluminum content change in regions 112a to 112b shown in FIG. 5), and the aluminum content, indium content, or forming temperature or other values of every two regions is composed of the fixed region 112a and the gradient region 112b. In other words, every two regions are composed of one fixed region 112a with a fixed value and one gradient region 112b with a linearly increasing value. The "gradually reduced stepwise" is defined as the change in the maximum value of the aluminum content, indium content, or forming temperature or other values in several regions reducing along the thickness direction (for example, the aluminum content change in regions 114a to 114b shown in FIG. 6), and the aluminum content, indium content, or forming temperature or other values of every two regions is composed of the fixed region 114a and the gradient region 114b. In other words, every two regions are composed of one fixed region with a fixed value and one gradient region with a linearly reducing value.

Figure 3:
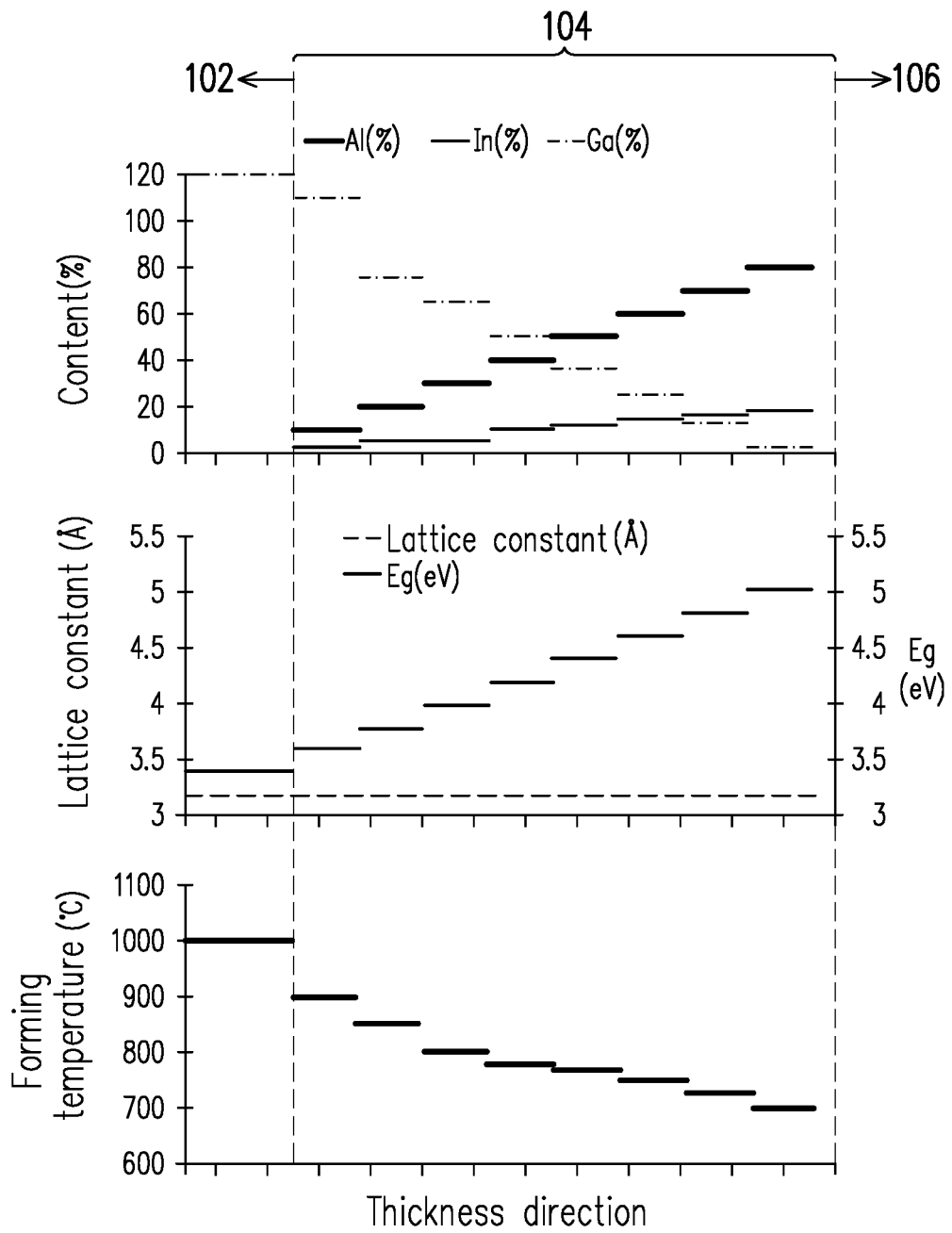
FIG. 3 is a diagram of the content change, forming temperature change, and characteristic change of the first chemical composition along the thickness direction of a portion of the epitaxial structure of the first embodiment.

FIG. 3 is a diagram showing a stepwise increase of the back diffusion barrier layer. Referring to FIG. 3, the aluminum content of the back diffusion barrier layer is, for example, increased stepwise along the thickness direction, the indium content thereof is, for example, increased stepwise along the thickness direction, and the gallium content is, for example, reduced stepwise along the thickness direction. The starting content of the aluminum content of the back diffusion barrier layer 104 is, for example, 0% to 50%, preferably 0% to 20%, and the end content thereof is, for example, 50% to 100%, preferably 60% to 90%. The starting content of the indium content is, for example, 0% to 50%, preferably 0% to 10%, and the end content thereof is, for example, 5% to 50%, preferably 5% to 30%. For example, the step slope of the aluminum content may be 0.1%/step to 50%/step, preferably 0.1%/step to 10%/step; the step slope of the indium content may be 0.1%/step to 20%/step, preferably 0.1%/step to 10%/step.

In the present embodiment, the forming temperature of the back diffusion barrier layer is reduced stepwise along the thickness direction, for example. The starting temperature of the forming temperature of the back diffusion barrier layer 104 is, for example, 800° C. to 1000° C., preferably 800° C. to 900° C., and the end temperature thereof is, for example, 600° C. to 900° C., preferably 650° C. to 800° C. For example, the step slope of the forming temperature may be −1° C./step to −100° C./step, preferably −1° C./step to −50° C./step.

In the present embodiment, via the chemical composition content change and the forming temperature change in the back diffusion barrier layer, the resulting energy gap of the back diffusion barrier layer is, for example, increased stepwise from 3.4±1 eV to 5.03±1 eV along the thickness direction, preferably increased stepwise from 3.4±0.5 eV to 5.03±0.5 eV. The lattice constant of the back diffusion barrier layer along the thickness direction is, for example, 3.2±0.3 Å, preferably 3.2±0.15 Å.

In addition, the back diffusion barrier layer may further include carbon, for example, and the carbon concentration thereof is increased stepwise along the thickness direction. The starting value of the carbon concentration of the back diffusion barrier layer 104 is, for example, 1E16 $cm^{-3}$ to 1E18 $cm^{-3}$, preferably 1E16 $cm^{-3}$ to 17E17 $cm^{-3}$, and the end value thereof is, for example, 1E17 $cm^{-3}$ to 1E19 $cm^{-3}$, preferably 1E17 $cm^{-3}$ to 1E18 $cm^{-3}$.

Figure 4:
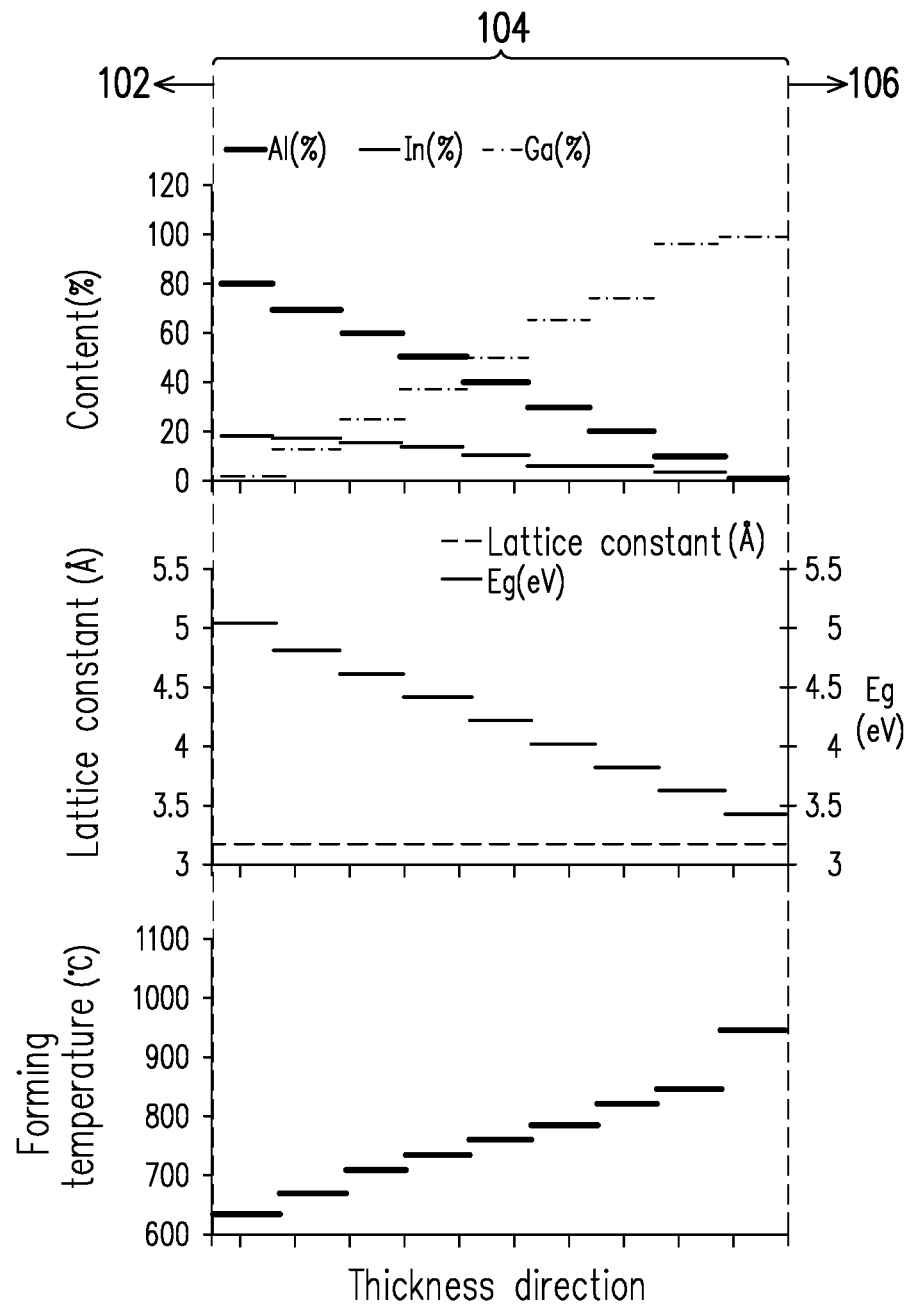
FIG. 4 is a diagram of the content change, forming temperature change, and characteristic change of the second chemical composition along the thickness direction of a portion of the epitaxial structure of the first embodiment.

FIG. 4 is a diagram showing a stepwise reduction of the back diffusion barrier layer. Referring to FIG. 4, the aluminum content of the back diffusion barrier layer is, for example, reduced stepwise along the thickness direction, the indium content thereof is, for example, reduced stepwise along the thickness direction, and the gallium content is, for example, increased stepwise along the thickness direction. The starting content of the aluminum content of the back diffusion barrier layer 104 is, for example, 50% to 100%, preferably 60% to 90%, and the end content thereof is, for example, 0% to 50%, preferably 0% to 20%. The starting content of the indium content is, for example, 5% to 50%, preferably 5% to 30%, and the end content thereof is, for example, 0% to 50%, preferably 0% to 10%. For example, the step slope of the aluminum content may be −0.1%/step to −50%/step, preferably −0.1%/step to −10%/step; the step slope of the indium content may be −0.1%/step to −20%/step, preferably −0.1%/step to −10%/step.

In the present embodiment, the forming temperature of the back diffusion barrier layer is increased stepwise along the thickness direction, for example. The starting temperature of the forming temperature of the back diffusion barrier layer 104 is, for example, 600° C. to 900° C., preferably 650° C. to 800° C., and the end temperature thereof is, for example, 800° C. to 1000° C., preferably 800° C. to 900° C. For example, the step slope of the forming temperature may be 1° C./step to 100° C./step, preferably 1° C./step to 50° C./step.

In the present embodiment, via the chemical composition content change and the forming temperature change in the back diffusion barrier layer, the resulting energy gap of the back diffusion barrier layer is, for example, reduced stepwise from 5.03±1 eV to 3.4±1 eV along the thickness direction, preferably reduced stepwise from 5.03±0.5 eV to 3.4±0.5 eV. The lattice constant of the back diffusion barrier layer along the thickness direction is, for example, 3.2±0.3 Å, preferably 3.2±0.15 Å.

In addition, the back diffusion barrier layer may further include carbon, for example, and the carbon concentration thereof is reduced stepwise along the thickness direction. The starting value of the carbon concentration of the back diffusion barrier layer 104 is, for example, 1E17 $cm^{-3}$ to 1E19 $cm^{-3}$, preferably 1E17 $cm^{-3}$ to 1E18 $cm^{-3}$, and the end value thereof is, for example, 1E16 $cm^{-3}$ to 1E18 $cm^{-3}$, preferably 1E16 $cm^{-3}$ to 17E17 $cm^{-3}$.

Figure 5:
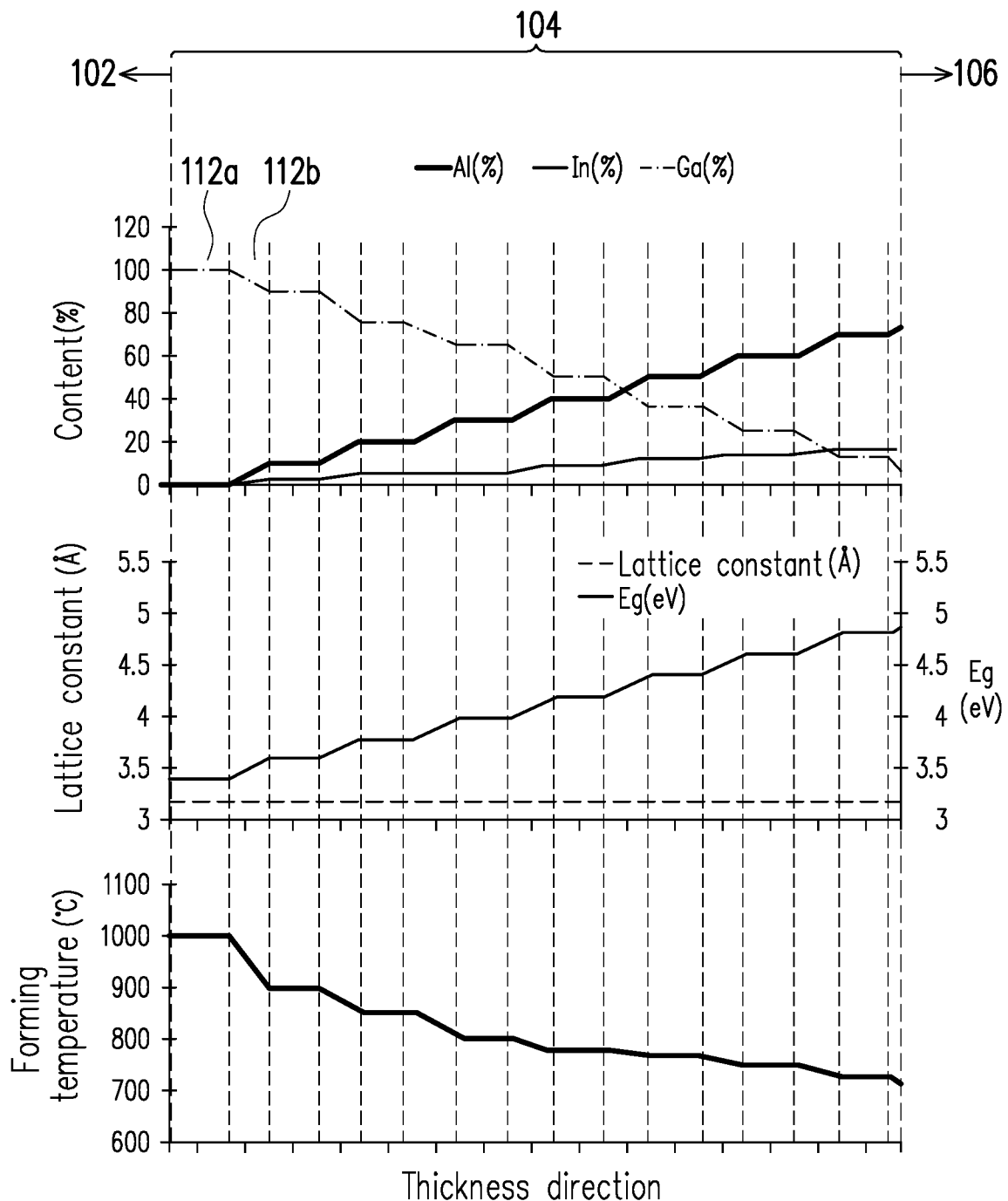
FIG. 5 is a diagram of the content change, forming temperature change, and characteristic change of the third chemical composition along the thickness direction of a portion of the epitaxial structure of the first embodiment.

FIG. 5 is a diagram showing a gradual stepwise increase of the back diffusion barrier layer. Referring to FIG. 5, the aluminum content of the back diffusion barrier layer is, for example, gradually increased stepwise along the thickness direction, the indium content thereof is, for example, gradually increased stepwise along the thickness direction, and the gallium content is, for example, gradually reduced stepwise along the thickness direction. Taking FIG. 5 as an example, the back diffusion barrier layer 104 includes 16 regions. In other words, the back diffusion barrier layer 104 includes 8 fixed regions 112a and 8 gradient regions 112b, and the fixed regions and the gradient regions are alternated with each other. The starting content of the aluminum content of the back diffusion barrier layer 104 is, for example, 0% to 50%, preferably 0% to 20%, and the end content thereof is, for example, 50% to 100%, preferably 60% to 90%. The starting content of the indium content is, for example, 0% to 50%, preferably 0% to 10%, and the end content thereof is, for example, 5% to 50%, preferably 5% to 30%. For example, the step slope of the aluminum content may be 0.1%/step to 50%/step, preferably 0.1%/step to 10%/step; the step slope of the indium content may be 0.1%/step to 20%/step, preferably 0.1%/step to 10%/step. The gradient slope of the aluminum content may be 1%/nm to 50%/nm, preferably 1%/nm to 30%/nm; the gradient slope of the indium content may be 1%/nm to 10%/nm, preferably 1%/nm to 5%/nm.

In the present embodiment, the forming temperature of the back diffusion barrier layer is gradually reduced stepwise along the thickness direction, for example. The starting temperature of the forming temperature of the back diffusion barrier layer 104 is, for example, 800° C. to 1000° C., preferably 800° C. to 900° C., and the end temperature thereof is, for example, 600° C. to 900° C., preferably 650° C. to 800° C. For example, the step slope of the forming temperature may be −1° C./step to −100° C./step, preferably −1° C./step to −50° C./step. The gradient slope of the forming temperature may be −1° C./sec to −10° C./sec, preferably −1° C./sec to −5° C./sec.

In the present embodiment, via the chemical composition content change and the forming temperature change in the back diffusion barrier layer, the resulting energy gap of the back diffusion barrier layer is, for example, gradually increased stepwise from 3.4±1 eV to 5.03±1 eV along the thickness direction, preferably gradually increased stepwise from 3.4±0.5 eV to 5.03±0.5 eV. The lattice constant of the back diffusion barrier layer along the thickness direction is, for example, 3.2±0.3 Å, preferably 3.2±0.15 Å.

In addition, the back diffusion barrier layer may further include carbon, for example, and the carbon concentration thereof is gradually increased stepwise along the thickness direction. The starting value of the carbon concentration of the back diffusion barrier layer 104 is, for example, 1E16 $cm^{-3}$ to 1E18 $cm^{-3}$, preferably 1E16 $cm^{-3}$ to 17E17 $cm^{-3}$, and the end value thereof is, for example, 1E17 $cm^{-3}$ to 1E19 $cm^{-3}$, preferably 1E17 $cm^{-3}$ to 1E18 $cm^{-3}$.

Figure 6:
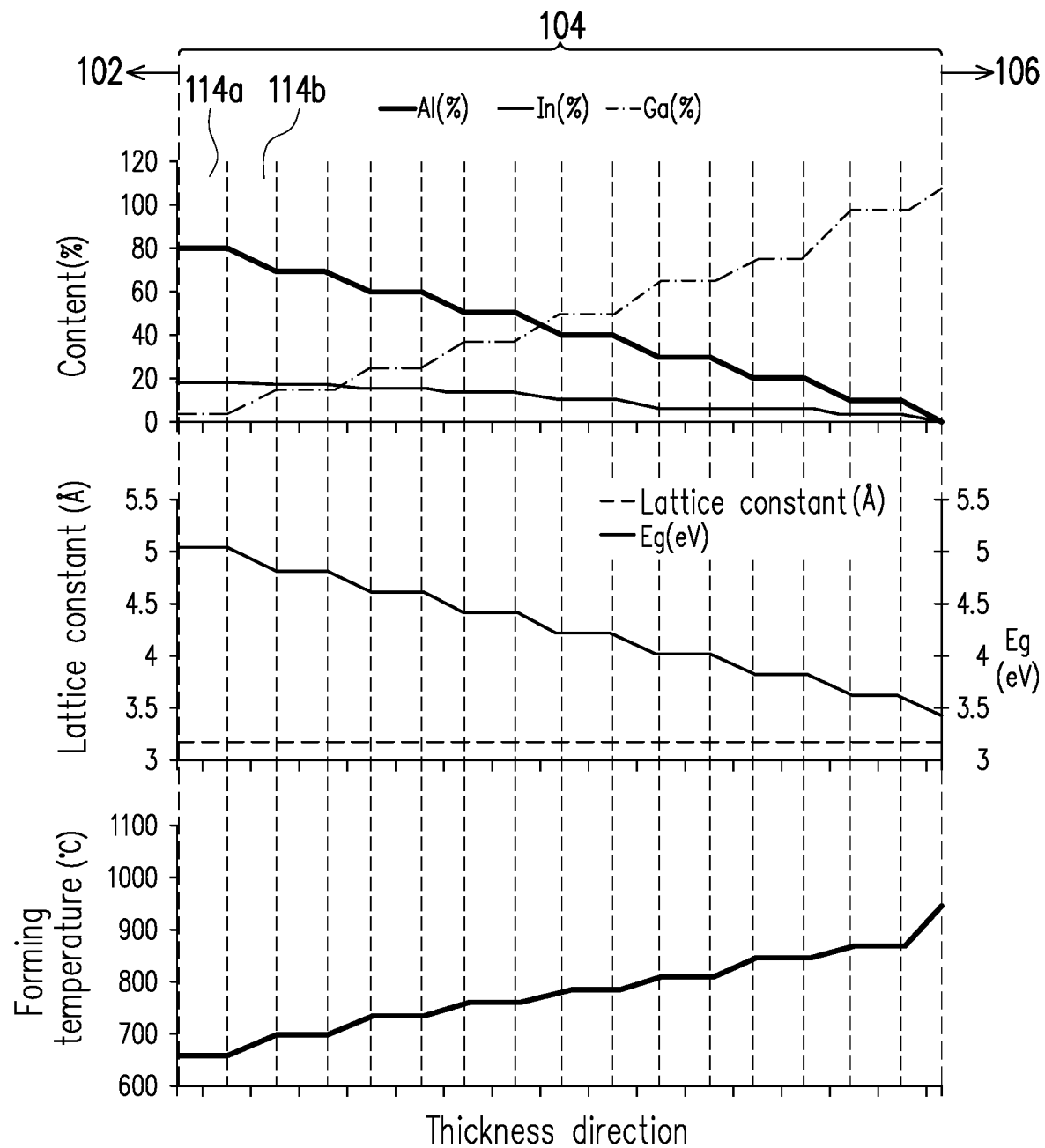
FIG. 6 is a diagram of the content change, forming temperature change, and characteristic change of the fourth chemical composition along the thickness direction of a portion of the epitaxial structure of the first embodiment.

FIG. 6 is a diagram showing a stepwise reduction of the back diffusion barrier layer. Referring to FIG. 6, the aluminum content of the back diffusion barrier layer is, for example, gradually reduced stepwise along the thickness direction, the indium content thereof is, for example, gradually reduced stepwise along the thickness direction, and the gallium content is, for example, gradually increased stepwise along the thickness direction. Taking FIG. 6 as an example, the back diffusion barrier layer 104 includes 16 regions. In other words, the back diffusion barrier layer 104 includes 8 fixed regions 114a and 8 gradient regions 114b, and the fixed regions and the gradient regions are alternated with each other. The starting content of the aluminum content of the back diffusion barrier layer 104 is, for example, 50% to 100%, preferably 60% to 90%, and the end content thereof is, for example, 0% to 50%, preferably 0% to 20%. The starting content of the indium content is, for example, 5% to 50%, preferably 5% to 30%, and the end content thereof is, for example, 0% to 50%, preferably 0% to 10%. For example, the step slope of the aluminum content may be −0.1%/step to −50%/step, preferably −0.1%/step to −10%/step; the step slope of the indium content may be −0.1%/step to −20%/step, preferably −0.1%/step to −10%/step. The gradient slope of the aluminum content may be −1%/nm to −50%/nm, preferably −1%/nm to −30%/nm; the gradient slope of the indium content may be −1%/nm to −10%/nm, preferably −1%/nm to −5%/nm.

In the present embodiment, the forming temperature of the back diffusion barrier layer is gradually increased stepwise along the thickness direction, for example. The starting temperature of the forming temperature of the back diffusion barrier layer 104 is, for example, 600° C. to 900° C., preferably 650° C. to 800° C., and the end temperature thereof is, for example, 800° C. to 1000° C., preferably 800° C. to 900° C. For example, the step slope of the forming temperature may be 1° C./step to 100° C./step, preferably 1° C./step to 50° C./step. The gradient slope of the forming temperature may be 1° C./sec to 10° C./sec, preferably 1° C./sec to 5° C./sec. Via the specific forming temperature change of the back diffusion barrier layer, a back diffusion barrier layer with a stepwise gradient aluminum content may be directly formed to prevent the dopant in, for example, the buffer layer from diffusing into the channel layer, thereby improving the carrier limitation ability.

As a result, via the chemical composition content change and the forming temperature change in the back diffusion barrier layer, the resulting energy gap of the back diffusion barrier layer is, for example, gradually reduced stepwise from 5.03±1 eV to 3.4±1 eV along the thickness direction, preferably gradually reduced stepwise from 5.03±0.5 eV to 3.4±0.5 eV. The lattice constant of the back diffusion barrier layer along the thickness direction is, for example, 3.2±0.3 Å, preferably 3.2±0.15 Å, wherein compared with the embodiments shown in FIG. 3 to FIG. 5, the embodiment shown in FIG. 6 has better lattice matching of the back diffusion barrier layer, and the forming temperature thereof is gradually increased stepwise. Therefore, the quality of the subsequently formed channel layer may be prevented from degrading, and as a result better epitaxial structure and device characteristics may be obtained.

In addition, the back diffusion barrier layer may further include carbon, for example, and the carbon concentration thereof is gradually reduced stepwise along the thickness direction. The starting value of the carbon concentration of the back diffusion barrier layer 104 is, for example, 1E17 $cm^{-3}$ to 1E19 $cm^{-3}$, preferably 1E17 $cm^{-3}$ to 1E18 $cm^{-3}$, and the end value thereof is, for example, 1E16 $cm^{-3}$ to 1E18 $cm^{-3}$, preferably 1E16 $cm^{-3}$ to 17E17 $cm^{-3}$.

In FIG. 3 to FIG. 6, via a specific aluminum content change, indium content change, and forming temperature change of the back diffusion barrier layer, the lattice matching of the epitaxial structure is improved, thereby reducing interface defects. At the same time, a diffusion barrier effect is achieved and carrier limitation ability is improved, thereby improving device characteristics. From the viewpoint of lattice matching, the embodiment shown in FIG. 6 is preferred because the lattice matching of the resulting epitaxial structure is higher, such that the diffusion barrier ability and carrier limitation ability may be improved more effectively, and therefore better device characteristics may be obtained.

Figure 7:
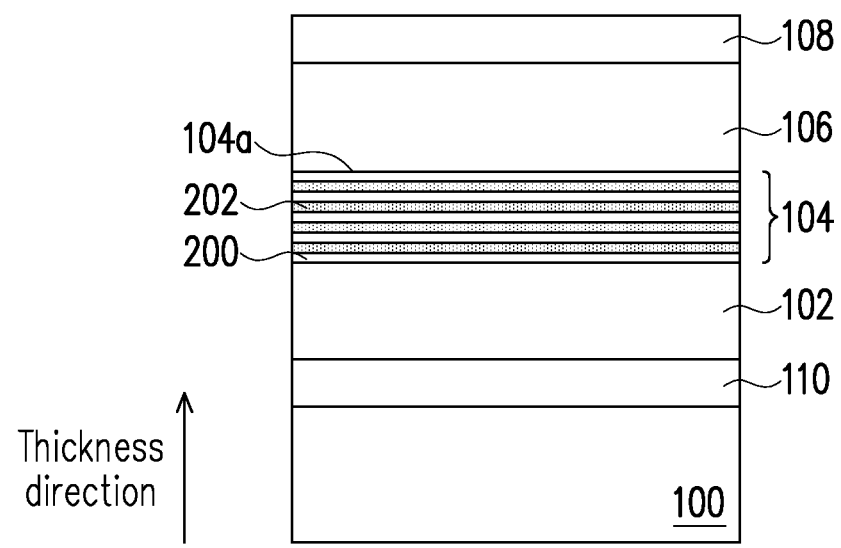
FIG. 7 is a cross-sectional view of the epitaxial structure of the second embodiment of the invention.

FIG. 7 is a cross-sectional view of an epitaxial structure according to the second embodiment of the invention, wherein the same or similar reference numerals as those in the first embodiment are used to denote the same or similar components, and the description of the same components is as provided in the first embodiment, and is not repeated herein.

Referring to FIG. 7, the difference between the epitaxial structure of the second embodiment and the epitaxial structure of the first embodiment is that the back diffusion barrier layer 104 is composed by alternately stacking a plurality of gallium nitride films 200 and a plurality of aluminum indium gallium nitride films 202 in the thickness direction, wherein the chemical composition of the aluminum indium gallium nitride films 202 is $Al_xIn_yGa_{1-x-y}N$, and $0 \leq x \leq 1$ and $0 \leq y \leq 1$, such as $0.1 \leq x \leq 0.8$ and $0.022 \leq y \leq 0.176$. The aluminum content and the indium content of the aluminum indium gallium nitride films 202 are changed stepwise or gradually changed stepwise along the thickness direction. Moreover, the thickness of the back diffusion barrier layer 104 is, for example, between 1 nm and 5000 nm, preferably between 50 nm and 3000 nm. The thickness of a single layer of the aluminum indium gallium nitride films 202 in the back diffusion barrier layer 104 is, for example, between 1 nm and 600 nm, preferably between 1 nm and 300 nm. Moreover, the number of layers of the plurality of aluminum indium gallium nitride films 202 is, for example, 2 to 30, preferably 2 to 10.

Although FIG. 7 shows 5 layers of the gallium nitride films 200 and 4 layers of the aluminum indium gallium nitride films 202, the invention is not limited thereto. In other embodiments, the number of layers of the gallium nitride films 200 and the aluminum indium gallium nitride films 202 may be adjusted according to the requirements of device design. In addition, in the present embodiment, the gallium nitride films 200 are disposed on a side of the back diffusion barrier layer 104 close to the buffer layer 102, for example, and are in contact with the buffer layer 102. In another embodiment, the aluminum indium gallium nitride films 202 may also be disposed on a side of the back diffusion barrier layer 104 in contact with the buffer layer 102, but the invention is not limited thereto, and adjustment may also be made according to the requirements of device design.

Moreover, the gallium nitride films 200 are disposed on a side of the back diffusion barrier layer 104 close to the channel layer 106 and are in contact with the channel layer 106, for example. In another embodiment, the aluminum indium gallium nitride films 202 may also be disposed on a side of the back diffusion barrier layer 104 in contact with the channel layer 106, but the invention is not limited thereto, and adjustment may also be made according to the requirements of device design.

FIG. 8 to FIG. 11 are diagrams of chemical composition content change, forming temperature change, and characteristic change of the back diffusion barrier layer along the thickness direction in the epitaxial structure of the second embodiment.

Figure 8:
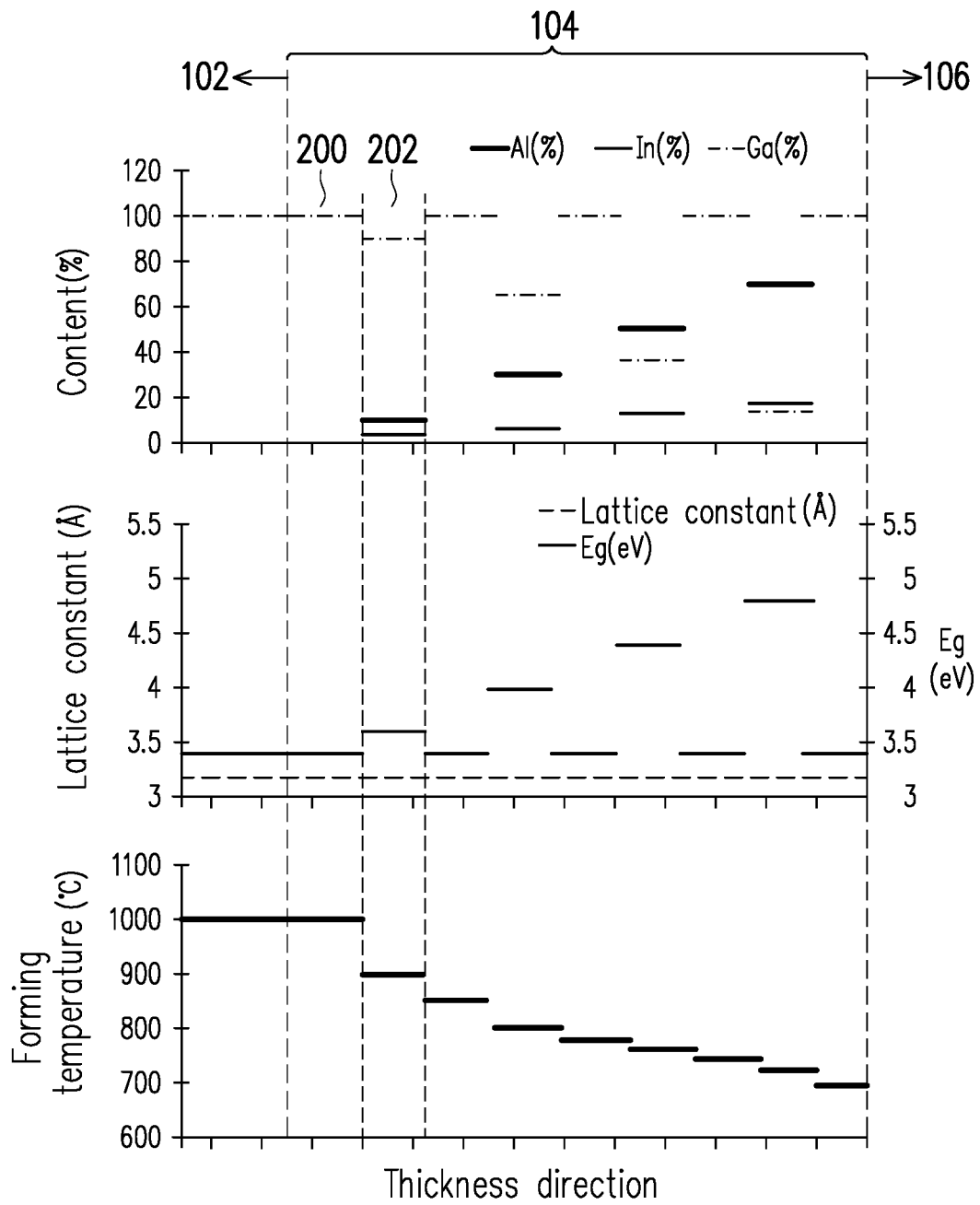
FIG. 8 is a diagram of the content change, forming temperature change, and characteristic change of the first chemical composition along the thickness direction of a portion of the epitaxial structure of the second embodiment.

Please refer to FIG. 8, as shown in the chemical composition content change, forming temperature change, and characteristic change shown in FIG. 3, the aluminum content in the plurality of aluminum indium gallium nitride films 202 of the back diffusion barrier layer 104 along the thickness direction is, for example, increased stepwise, the indium content thereof is, for example, increased stepwise along the thickness direction, and the energy gap thereof is increased stepwise from 3.4±1 eV to 5.03±1 eV along the thickness direction.

Figure 9:
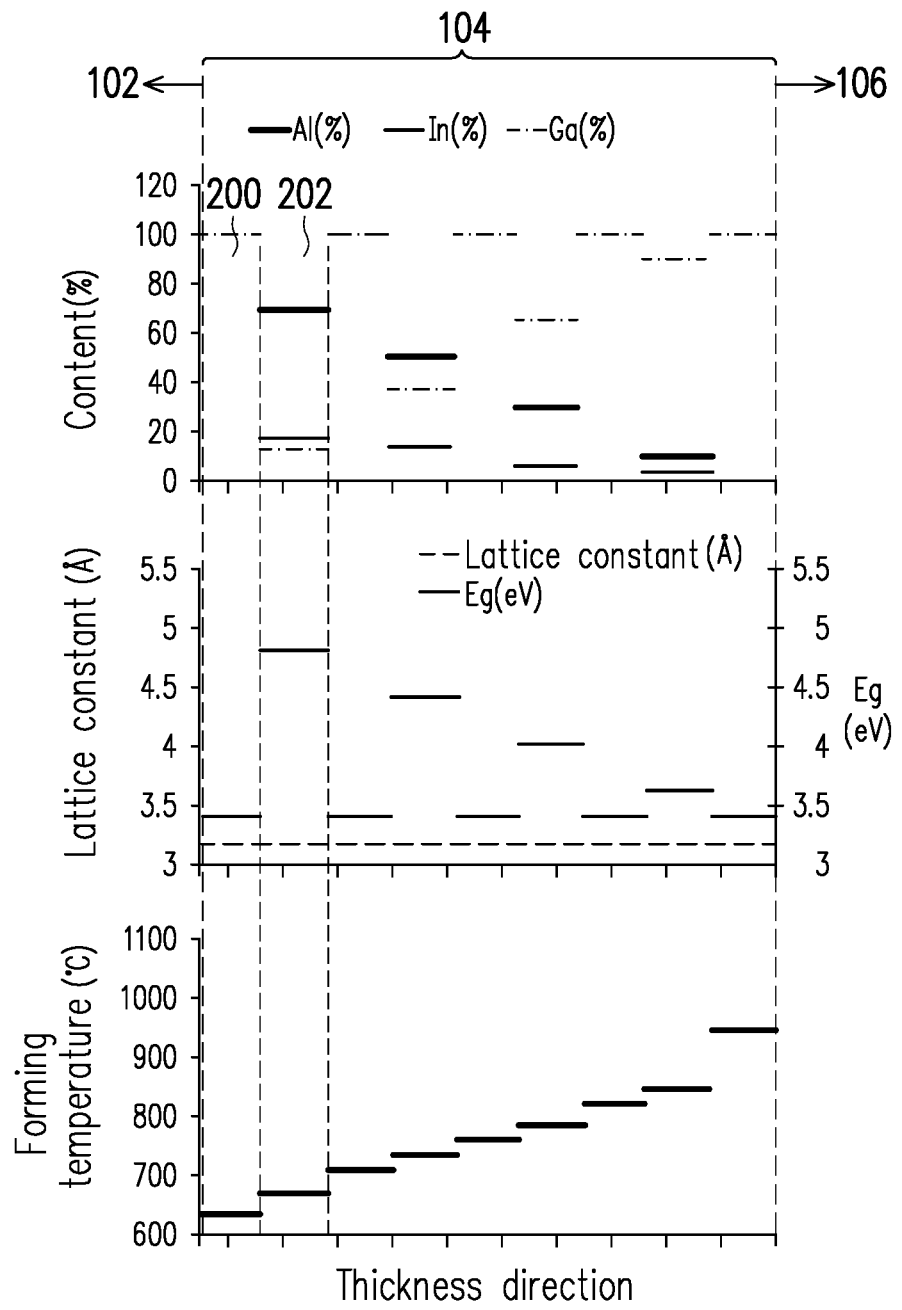
FIG. 9 is a diagram of the content change, forming temperature change, and characteristic change of the second chemical composition along the thickness direction of a portion of the epitaxial structure of the second embodiment.

Please refer to FIG. 9, as shown in the chemical composition content change, forming temperature change, and characteristic change shown in FIG. 4, the aluminum content in the plurality of aluminum indium gallium nitride films 202 of the back diffusion barrier layer 104 along the thickness direction is, for example, reduced stepwise, the indium content thereof is, for example, reduced stepwise along the thickness direction, and the energy gap thereof is reduced stepwise from 5.03±1 eV to 3.4±1 eV along the thickness direction.

Please refer to FIG. 8 and FIG. 9 at the same time. The chemical composition content change and characteristic change in the plurality of gallium nitride films 200 of the back diffusion barrier layer 104 are maintained at a fixed value. For example, the gallium content is, for example, >95%, preferably 100%; the energy gap is, for example, 3.4±1 eV, preferably 3.4±0.5 eV.

Figure 10:
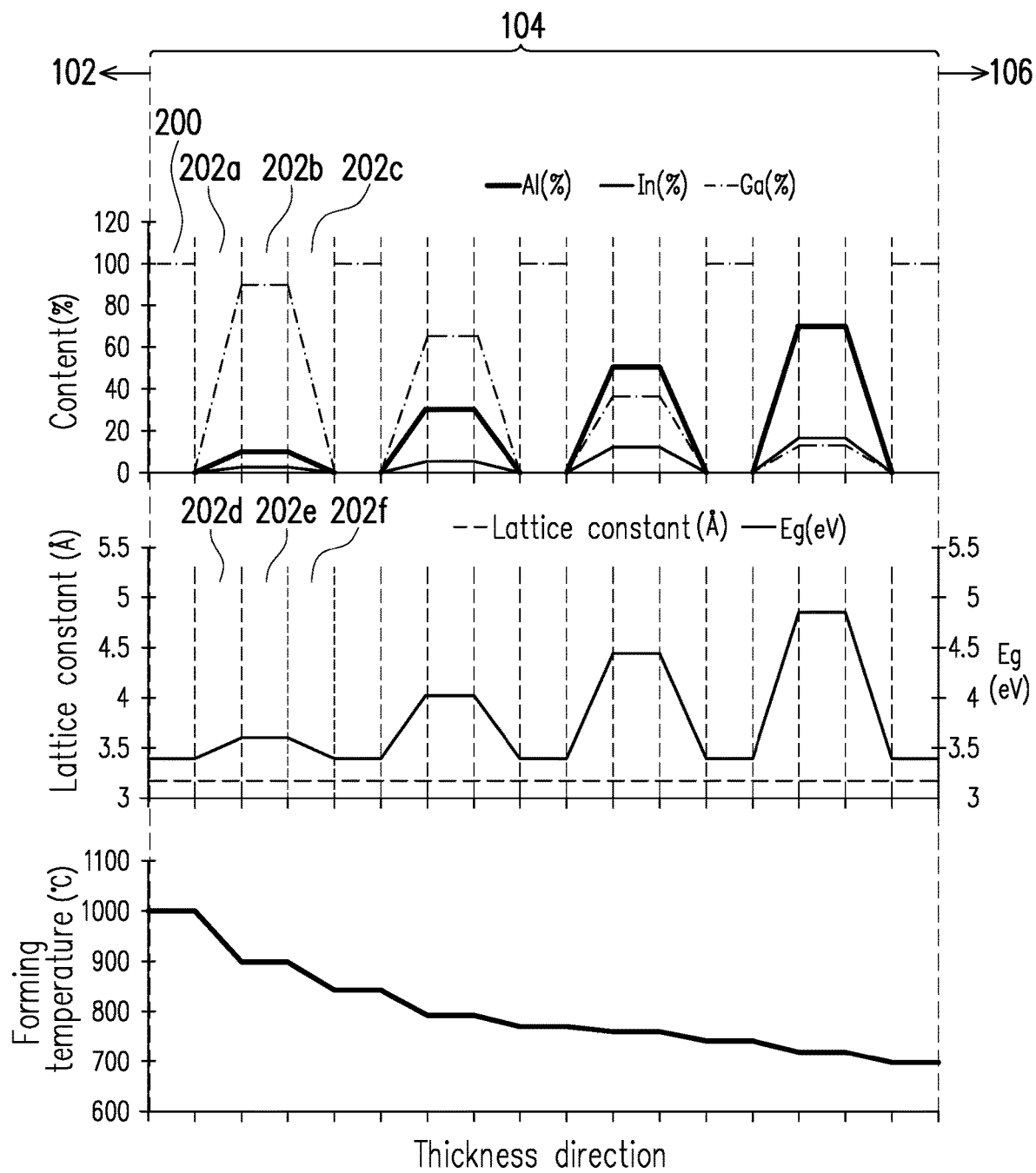
FIG. 10 is a diagram of the content change, forming temperature change, and characteristic change of the third chemical composition along the thickness direction of a portion of the epitaxial structure of the second embodiment.
Figure 11:
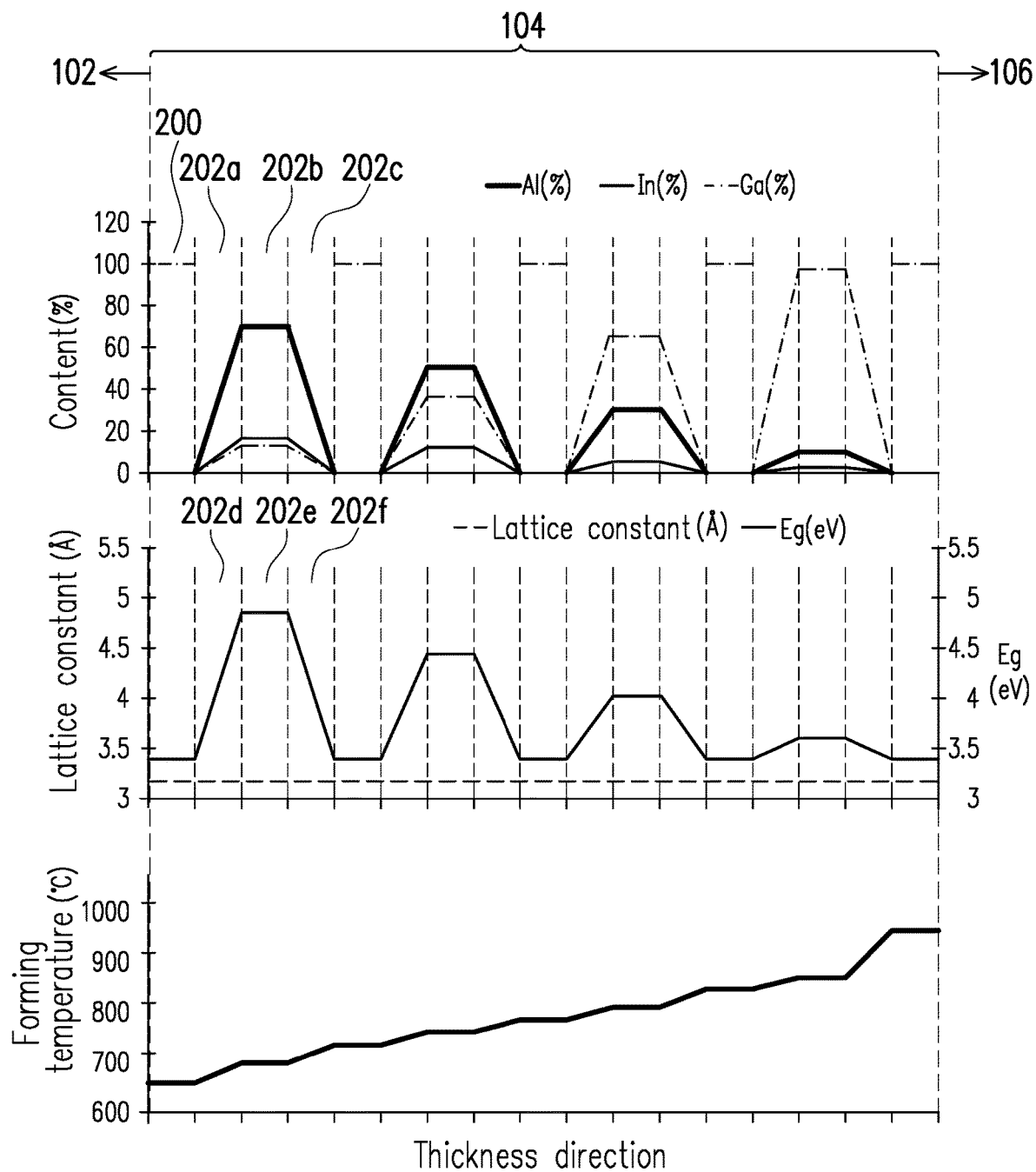
FIG. 11 is a diagram of the content change, forming temperature change, and characteristic change of the fourth chemical composition along the thickness direction of a portion of the epitaxial structure of the second embodiment.

Referring to FIG. 10 and FIG. 11, the aluminum indium gallium nitride films 202 of the back diffusion barrier layer 104 are, for example, composed of a plurality of fixed regions and a plurality of gradient regions, and each gradient region is between two fixed regions, and the values of the two fixed regions adjacent to each gradient region are different fixed values. Moreover, the chemical composition content change and characteristic change in the plurality of gallium nitride films 200 of the back diffusion barrier layer 104 are maintained at a fixed value. For example, the gallium content is, for example, >95%, preferably 100%; the energy gap is, for example, 3.4±1 eV, preferably 3.4±0.5 eV.

In FIG. 10, the aluminum content and the indium content of each layer in the plurality of aluminum indium gallium films 202 of the back diffusion barrier layer 104 are, for example, composed of a three-stage change, wherein the three-stage change includes, for example, a first gradient region 202a gradually changed from 0 to a maximum value, a fixed region 202b fixed at the maximum value, and a second gradient region 202c gradually changed from the maximum value to 0. In particular, the aluminum content and indium content of the fixed region 202b are increased stepwise along the thickness direction, and the step slope of the aluminum content is 0.1%/step to 50%/step, preferably 0.1%/step to 10%/step, the step slope of the indium content is 0.1%/step to 20%/step, preferably 0.1%/step to 10%/step. The gradient slope of the aluminum content of the first gradient region 202a is 1%/nm to 50%/nm, preferably 1%/nm to 30%/nm, and the gradient slope of the aluminum content of the second gradient region 202c is −1%/nm to −50%/nm, preferably −1%/nm to −30%/nm. The gradient slope of the indium content of the first gradient region 202a is 1%/nm to 10%/nm, preferably 1%/nm to 5%/nm, and the gradient slope of the indium content of the second gradient region 202c is −1%/nm to −10%/nm, preferably −1%/nm to −5%/nm.

Moreover, the energy gap of each layer in the plurality of aluminum indium gallium films 202 of the back diffusion barrier layer 104 is, for example, composed of a three-stage change, wherein the three-stage change includes, for example, a first gradient region 202d gradually changed from a minimum value to a maximum value, a fixed region 202e fixed at the maximum value, and a second gradient region 202f gradually changed from the maximum value to the minimum value. For example, the value of the fixed region 202e is, for example, increased stepwise from 3.4±1 eV to 5.03±1 eV along the thickness direction, preferably increased stepwise from 3.4±0.5 eV to 5.03±0.5 eV. The energy gap of the first gradient region 202d is gradually increased along the thickness direction, and the energy gap of the second gradient region 202f is gradually reduced along the thickness direction. In addition, the minimum value of the energy gap in the plurality of aluminum indium gallium nitride films 202 is, for example, the same. For example, the minimum value of the energy gap is, for example, 3.4±1 eV, preferably 3.4±0.5 eV.

In FIG. 11, the difference from the embodiment of FIG. 10 is that: the value of the fixed region 202b of the aluminum content and the indium content of each layer in the plurality of aluminum indium gallium nitride films 202 is reduced stepwise along the thickness direction, and the step slope of the aluminum content is −0.1%/step to −50%/step, preferably −0.1%/step to −10%/step, and the step slope of the indium content is −0.1%/step to −20%/step, preferably −0.1%/step to −10%/step. In addition, the value of the fixed region 202e of the energy gap of each layer in the plurality of aluminum indium gallium films 202 is reduced stepwise along the thickness direction, for example, from 5.03±1 eV to 3.4±1 eV, preferably reduced stepwise from 5.03±0.5 eV to 3.4±0.5 eV. The energy gap of the first gradient region 202d is gradually increased along the thickness direction, and the energy gap of the second gradient region 202f is gradually reduced along the thickness direction.

Based on the above, according to the epitaxial structure of the invention, via the combination of a change in different chemical composition contents (x value and y value) in the back diffusion barrier layer of $Al_xIn_yGa_{1-x-y}N$, the same lattice constant, and forming temperature change, the lattice matching of the epitaxial structure may be improved, the interface defect density may be reduced, and the quality of the channel layer may be maintained. At the same time, a diffusion barrier effect is achieved and carrier limitation ability is improved, thereby improving the DC current, leakage current, dynamic characteristics, and RF characteristics and the like of the device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An epitaxial structure, comprising:
a substrate;
a buffer layer formed on the substrate;
a back diffusion barrier layer formed on the buffer layer, wherein a chemical composition of the back diffusion barrier layer is $Al_xIn_yGa_{1-x-y}N$, and $0 \leq x \leq 1$ and $0 \leq y \leq 1$, a lattice constant of the back diffusion barrier layer is between 2.9 Å and 3.5 Å, the back diffusion barrier layer is composed of a plurality of regions in a thickness direction, an aluminum (Al) content and an indium (In) content of the back diffusion barrier layer are changed stepwise or gradually changed stepwise along the thickness direction, the aluminum content and the indium content of the back diffusion barrier layer increase or decrease in a single direction parallel to the thickness direction, the back diffusion barrier layer further comprises a carbon, and a carbon concentration is changed stepwise or gradually changed stepwise along the thickness direction;
a channel layer formed on the back diffusion barrier layer; and
a barrier layer formed on the channel layer.

2. The epitaxial structure of claim 1, wherein in the back diffusion bather layer, the aluminum content is increased stepwise along the thickness direction, the indium content is increased stepwise along the thickness direction, a step slope of the aluminum content is 0.1%/step to 50%/step, and a step slope of the indium content is 0.1%/step to 20%/step,
an energy gap of the back diffusion barrier layer is increased stepwise from 3.4±1 eV to 5.03±1 eV along the thickness direction,
the carbon concentration of the back diffusion barrier layer is increased stepwise along the thickness direction, a starting value of the carbon concentration is 1E16 $cm^{-3}$ to 1E18 $cm^{-3}$, and an end value of the carbon concentration is 1E17 $cm^{-3}$ to 1E19 $cm^{-3}$,
a starting value of the aluminum content is 0% to 50%, an end value of the aluminum content is 50% to 100%, a starting value of the indium content is 0% to 50%, and an end value of the indium content is 5% to 50%.

3. The epitaxial structure of claim 1, wherein in the back diffusion barrier layer, the aluminum content is reduced stepwise along the thickness direction, the indium content is reduced stepwise along the thickness direction, a step slope of the aluminum content is −0.1%/step to −50%/step, and a step slope of the indium content is −0.1%/step to −20%/step,
an energy gap of the back diffusion barrier layer is reduced stepwise from 5.03±1 eV to 3.4±1 eV along the thickness direction,
the carbon concentration of the back diffusion barrier layer is reduced stepwise along the thickness direction, a starting value of the carbon concentration is 1E17 $cm^{-3}$ to 1E19 $cm^{-3}$, and an end value of the carbon concentration is 1E16 $cm^{-3}$ to 1E18 $cm^{-3}$,
a starting value of the aluminum content is 50% to 100%, an end value of the aluminum content is 0% to 50%, a starting value of the indium content is 5% to 50%, and an end value of the indium content is 0% to 50%.

4. The epitaxial structure of claim 1, wherein the aluminum content in the back diffusion barrier layer is gradually increased stepwise along the thickness direction, the indium content is gradually increased stepwise along the thickness direction, a step slope of the aluminum content is 0.1%/step to 50%/step, a step slope of the indium content is 0.1%/step to 20%/step, a gradient slope of the aluminum content is 1%/nm to 50%/nm, and a gradient slope of the indium content is 1%/nm to 10%/nm,
an energy gap of the back diffusion barrier layer is gradually increased stepwise from 3.4±1 eV to 5.03±1 eV along the thickness direction,
the carbon concentration of the back diffusion barrier layer is gradually increased stepwise along the thickness direction, a starting value of the carbon concentration is 1E16 $cm^{-3}$ to 1E18 $cm^{-3}$, and an end value of the carbon concentration is 1E17 $cm^{-3}$ to 1E19 $cm^{-3}$,
a starting value of the aluminum content is 0% to 50%, an end value of the aluminum content is 50% to 100%, a starting value of the indium content is 0% to 50%, and an end value of the indium content is 5% to 50%.

5. The epitaxial structure of claim 1, wherein the aluminum content in the back diffusion barrier layer is gradually reduced stepwise along the thickness direction, the indium content is gradually reduced stepwise along the thickness direction, a step slope of the aluminum content is −0.1%/step to −50%/step, a step slope of the indium content is −0.1%/step to −20%/step, a gradient slope of the aluminum content is −1%/nm to −50%/nm, and a gradient slope of the indium content is −1%/nm to −10%/nm,
an energy gap of the back diffusion barrier layer is gradually reduced stepwise from 5.03±1 eV to 3.4±1 eV along the thickness direction,
the carbon concentration of the back diffusion barrier layer is gradually reduced stepwise along the thickness direction, a starting value of the carbon concentration is 1E17 $cm^{-3}$ to 1E19 $cm^{-3}$, and an end value of the carbon concentration is 1E16 $cm^{-3}$ to 1E18 $cm^{-3}$,
a starting value of the aluminum content is 50% to 100%, an end value of the aluminum content is 0% to 50%, a starting value of the indium content is 5% to 50%, and an end value of the indium content is 0% to 50%.

6. The epitaxial structure of claim 1, wherein a thickness of the back diffusion barrier layer is between 1 nm and 200 nm and a number of layers thereof is 2 to 30.

7. An epitaxial structure, comprising:
a substrate;
a buffer layer formed on the substrate;
a back diffusion barrier layer formed on the buffer layer, wherein the back diffusion barrier layer is composed by alternately stacking a plurality of gallium nitride films and a plurality of aluminum indium gallium nitride films in a thickness direction, a chemical composition of the aluminum indium gallium nitride films is $Al_xIn_yGa_{1-x-y}N$, and $0 \leq x \leq 1$ and $0 \leq y \leq 1$, a lattice constant of the back diffusion barrier layer is between 2.9 Å and 3.5 Å, an aluminum content and an indium content of the plurality of aluminum indium gallium nitride films are changed stepwise or gradually changed stepwise along the thickness direction, the aluminum content and the indium content increase or decrease in a single direction parallel to the thickness direction, the back diffusion barrier layer further comprises a carbon, and a carbon concentration is changed stepwise or gradually changed stepwise along the thickness direction;
a channel layer formed on the back diffusion barrier layer; and
a barrier layer formed on the channel layer.

8. The epitaxial structure of claim 7, wherein in the plurality of aluminum indium gallium nitride films, the aluminum content is increased stepwise along the thickness direction, the indium content is increased stepwise along the thickness direction, a step slope of the aluminum content is 0.1%/step to 50%/step, and a step slope of the indium content is 0.1%/step to 20%/step,
an energy gap of the plurality of aluminum indium gallium nitride films is increased stepwise from 3.4±1 eV to 5.03±1 eV along the thickness direction,
the carbon concentration of the back diffusion barrier layer is increased stepwise along the thickness direction, a starting value of the carbon concentration is $1E16$ $cm^{-3}$ to $1E18$ $cm^{-3}$, and an end value of the carbon concentration is $1E17$ $cm^{-3}$ to $1E19$ $cm^{-3}$,
in the plurality of aluminum indium gallium nitride films, a starting value of the aluminum content is 0% to 50%, an end value of the aluminum content is 50% to 100%, a starting value of the indium content is 0% to 50%, and an end value of the indium content is 5% to 50%.

9. The epitaxial structure of claim 7, wherein in the plurality of aluminum indium gallium nitride films, the aluminum content is reduced stepwise along the thickness direction, the indium content is reduced stepwise along the thickness direction, a step slope of the aluminum content is −0.1%/step to −50%/step, and a step slope of the indium content is −0.1%/step to −20%/step,
an energy gap of the plurality of aluminum indium gallium nitride films is reduced stepwise from 5.03±1 eV to 3.4±1 eV along the thickness direction,
the carbon concentration of the back diffusion barrier layer is reduced stepwise along the thickness direction, a starting value of the carbon concentration is $1E17$ $cm^{-3}$ to $1E19$ $cm^{-3}$, and an end value of the carbon concentration is $1E16$ $cm^{-3}$ to $1E18$ $cm^{-3}$,
in the plurality of aluminum indium gallium nitride films, a starting value of the aluminum content is 50% to 100%, an end value of the aluminum content is 0% to 50%, a starting value of the indium content is 5% to 50%, and an end value of the indium content is 0% to 50%.

10. The epitaxial structure of claim 7, wherein the aluminum content and the indium content of each layer in the plurality of aluminum indium gallium nitride films are both composed of a three-stage change, and the three-stage change comprises: a first gradient region gradually changed from 0 to a maximum value, a fixed region fixed at the maximum value, and a second gradient region gradually changed from the maximum value to 0, wherein a value of the fixed region is increased stepwise along the thickness direction, a step slope of the aluminum content is 0.1%/step to 50%/step, a step slope of the indium content is 0.1%/step to 20%/step, a gradient slope of the aluminum content of the first gradient region is 1%/nm to 50%/nm, a gradient slope of the aluminum content of the second gradient region is −1%/nm to −50%/nm, a gradient slope of the indium content of the first gradient region is 1%/nm to 10%/nm, and a gradient slope of the indium content of the second gradient region is −1%/nm to −10%/nm,
in the plurality of aluminum indium gallium nitride films, a starting value of the aluminum content is 0% to 50%, an end value of the aluminum content is 50% to 100%, a starting value of the indium content is 0% to 50%, and an end value of the indium content is 5% to 50%.

11. The epitaxial structure of claim 10, wherein an energy gap of each layer in the plurality of aluminum indium gallium nitride films is composed of a three-stage change, and the three-stage change comprises: a first gradient region gradually changed from a minimum value to a maximum value, a fixed region fixed at the maximum value, and a second gradient region gradually changed from the maximum value to the minimum value, the minimum value of the energy gap in the plurality of aluminum indium gallium nitride films is the same, and a value of the fixed region is increased stepwise from 3.4±1 eV to 5.03±1 eV along the thickness direction.

12. The epitaxial structure of claim 10, wherein the carbon concentration of the back diffusion barrier layer is gradually increased stepwise along the thickness direction, a starting value of the carbon concentration is $1E16$ $cm^{-3}$ to $1E18$ $cm^{-3}$, and an end value of the carbon concentration is $1E17$ $cm^{-3}$ to $1E19$ $cm^{-3}$.

13. The epitaxial structure of claim 7, wherein the aluminum content and the indium content of each layer in the plurality of aluminum indium gallium nitride films are both composed of a three-stage change, and the three-stage change comprises: a first gradient region gradually changed from 0 to a maximum value, a fixed region fixed at the maximum value, and a second gradient region gradually changed from the maximum value to 0, wherein a value of the fixed region is reduced stepwise along the thickness direction, a step slope of the aluminum content is −0.1%/step to −50%/step, a step slope of the indium content is −0.1%/step to −20%/step, a gradient slope of the aluminum content of the first gradient region is 1%/nm to 50%/nm, a gradient slope of the aluminum content of the second gradient region is −1%/nm to −50%/nm, a gradient slope of the indium content of the first gradient region is 1%/nm to 10%/nm, and a gradient slope of the indium content of the second gradient region is −1%/nm to −10%/nm,
in the plurality of aluminum indium gallium nitride films, a starting value of the aluminum content is 50% to 100%, an end value of the aluminum content is 0% to 50%, a starting value of the indium content is 5% to 50%, and an end value of the indium content is 0% to 50%.

14. The epitaxial structure of claim 13, wherein an energy gap of each layer in the plurality of aluminum indium gallium nitride films is composed of a three-stage change, and the three-stage change comprises: a first gradient region gradually changed from a minimum value to a maximum value, a fixed region fixed at the maximum value, and a second gradient region gradually changed from the maximum value to the minimum value, the minimum value of the energy gap in the plurality of aluminum indium gallium nitride films is the same, and a value of the fixed region is reduced stepwise from 5.03±1 eV to 3.4±1 eV along the thickness direction.

15. The epitaxial structure of claim 13, wherein the carbon concentration of the back diffusion barrier layer is gradually reduced stepwise along the thickness direction, a starting value of the carbon concentration is $1E17$ $cm^{-3}$ to $1E19$ $cm^{-3}$, and an end value of the carbon concentration is $1E16$ $cm^{-3}$ to $1E18$ $cm^{-3}$.

16. The epitaxial structure of claim 7, wherein a thickness of the back diffusion barrier layer is between 1 nm and 5000 nm, a thickness of the aluminum indium gallium nitride films is between 1 nm and 600 nm, and a number of layers of the plurality of the aluminum indium gallium nitride films is 2 to 30.

* * * * *